(12) United States Patent
Sumitani (10) Patent No.: US 6,319,792 B2
(45) Date of Patent: Nov. 20, 2001

(54) SEMICONDUCTOR DEVICE MANUFACTURING METHOD AND SEMICONDUCTOR WAFER

(75) Inventor: Hidetoshi Sumitani, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/725,679

(22) Filed: Nov. 30, 2000

(30) Foreign Application Priority Data

Dec. 2, 1999 (JP) .................................................. 11-343786

(51) Int. Cl.$^7$ ...................................................... H01L 21/76
(52) U.S. Cl. ............................. 438/401; 438/14; 257/620
(58) Field of Search .................................. 438/14, 16, 18, 438/401, 405, 413, 106, 584; 257/226, 620, 707, 717, 796, 797

(56) References Cited

U.S. PATENT DOCUMENTS 5,596,223 * 1/1997 Asano ................................... 257/620

6,010,914 * 1/2000 Shishiguchi ............................ 438/14

FOREIGN PATENT DOCUMENTS

| 4-130709 | 5/1992 | (JP) . |
| 9-311432 | 12/1997 | (JP) . |

* cited by examiner

*Primary Examiner*—David Nelms
*Assistant Examiner*—Phuc T. Dang
(74) *Attorney, Agent, or Firm*—Foley & Lardner

(57) ABSTRACT

In a method of manufacturing a semiconductor device, a first chip region and a second chip region are provided on a silicon wafer. A first resist pattern for the semiconductor device is to be formed in the first chip region, and the second chip region includes a plurality of characteristic evaluation regions for the semiconductor device, and a second resist pattern is to be formed in each of the plurality of characteristic evaluation regions for the semiconductor device. A data rate of the second chip region is determined based on a data rate of the first chip region. The data rate of the second chip region is determined such that a ratio of the data rate of the first chip region to the data rate of the second chip region is in a range of ¼ to 4.

20 Claims, 7 Drawing Sheets

34:PATTERN REGION

Fig. 9

35:PATTERN REGION

SEMICONDUCTOR DEVICE MANUFACTURING METHOD AND SEMICONDUCTOR WAFER

BACKGROUND OF THE INVENTION

1. Field of the Invention

The present invention relates to a semiconductor device manufacturing method and a semiconductor wafer. More particularly, the present invention relates to a semiconductor device manufacturing method which includes a process of forming a resist pattern on a silicon wafer using a resist mask, and a semiconductor wafer.

2. Description of the Related Art

Conventionally, when a semiconductor device is manufactured, devices such as transistors are formed on a semiconductor chip of a silicon wafer, and are connected using wiring lines formed on the semiconductor chip to realize a desired circuit. In this case, a high pattern density region and a low pattern density region are present in the pattern such as gate electrodes and wiring lines. For example, when bonding pads are formed in a peripheral section of the semiconductor chip, any circuitry is not arranged in the region where the bonding pads are formed and the neighborhood region. In this way, there is a low pattern density region in the peripheral section of the semiconductor chip. When there are a high pattern density area and a low pattern density area in patterns such as the gate electrodes and the wiring lines, the size of the gate electrode or wiring line becomes smaller or thinner than the size of the originally designed gate electrode or wiring line. As a result, the deviation is caused in the sizes of the gate electrodes and wiring lines. The reason is thought of as follows.

A photo-resist is used, when a fine pattern forming process such as a process of forming a gate electrode and a wiring line is carried out in a semiconductor device manufacturing process. A method of forming a positive type photo-resist pattern will be described below.

First, resist material is applied onto a silicon wafer and a resist layer is formed. Subsequently, the resist layer is exposed using a predetermined mask. The resist material in the exposed part is subjected to light reaction so that the resist material becomes soluble to resist developer. The soluble resist layer is developed using the resist developer. Then, only a part of the resist layer which has been not exposed remains and is formed as a resist pattern.

Generally, the resist pattern formed on the silicon wafer has a high pattern density region and a low pattern density region. In this case, in the development of the resist pattern, the development proceeds fast in the low pattern density region of the resist pattern, compared with the high pattern density region of the resist pattern. The difference in the development rate would be caused because development solution becomes excessive relatively in the low pattern density region of the resist pattern so that the development proceeds fast. As the result, the resist pattern is more excessively developed in the low pattern density region of the resist pattern than in the high pattern density region of the resist pattern. The gate electrode and the wiring line are formed using the above-mentioned resist pattern as a mask. For this reason, the deviation is caused in the size of the formed gate electrode and wiring line. The deviation in the size of the formed gate electrode leads the deviation in the characteristics of the gate electrode such as a threshold voltage. Also, the deviation in the size of the wiring line leads the deviation in the characteristics of the wiring line such as the wiring line capacity and the wiring line resistance. In any case, it brings about hindrance to the operation of the manufactured semiconductor circuit. In case of the worst, the wiring line is broken and a connection part of the wiring lines is broken. As a result, the formed device itself sometimes becomes fault.

Also, TEG (Test Element Group) chips for a test are formed on the silicon wafer other than product chips. Using the TEG chip, the analysis and evaluation of the process, device and circuit are carried out. The TEG chip has a TEG region which contains a TEG. The TEG is composed of a plurality of devices which are different from each other in size and a plurality of wiring patterns which are different from each other in width and length. The TEG is used to monitor the characteristics of the device formed on the silicon wafer and the forming state of the wiring lines.

A plurality of pads are provided for the TEG region of the TEG chip. Each device and each wiring line of the TEG are connected with the pads. By pushing probes of a test apparatus to the pads, the characteristics of each device and each wiring line of the TEG can be monitored. The size of the pad is larger than the device and the wiring line. Thus, the pad occupies a great part of the TEG region. Therefore, the TEG chip has a lower pattern density than the product chip. When the product chip is a chip for 64M DRAM, the pattern density of the product chip is 36.3% in the gate electrode and the pattern density of the TEG chip is 15.3%. In the future, even if the gate density of the product chip increases, it is difficult to increase the pattern density of the TEG chip. This is because the pattern density of the TEG region of the TEG chip is under a restriction in the total size of the plurality of pads which occupy a great part of the TEG region.

In this way, in case where devices and wiring lines are formed in the product chip and the TEG chip on the silicon wafer, the difference in pattern density is caused between the product chip and the TEG chip. Therefore, the deviation is caused in the sizes of the devices and wiring lines which are formed in the product chip and the TEG chip. Especially, the devices and the wiring lines of the TEG chip are formed in the lower pattern density than that of the product chip as mentioned above. Therefore, the device and the wiring line of the TEG chip are formed in the size different from the previously designed size. As a result, inconvenience is present that the characteristics of the device formed in the TEG chip cannot be correctly monitored using the device and the wiring lines formed actually. Especially, the above inconvenience is easy to occur in a gate electrode formed in the TEG chip.

Figure 1:
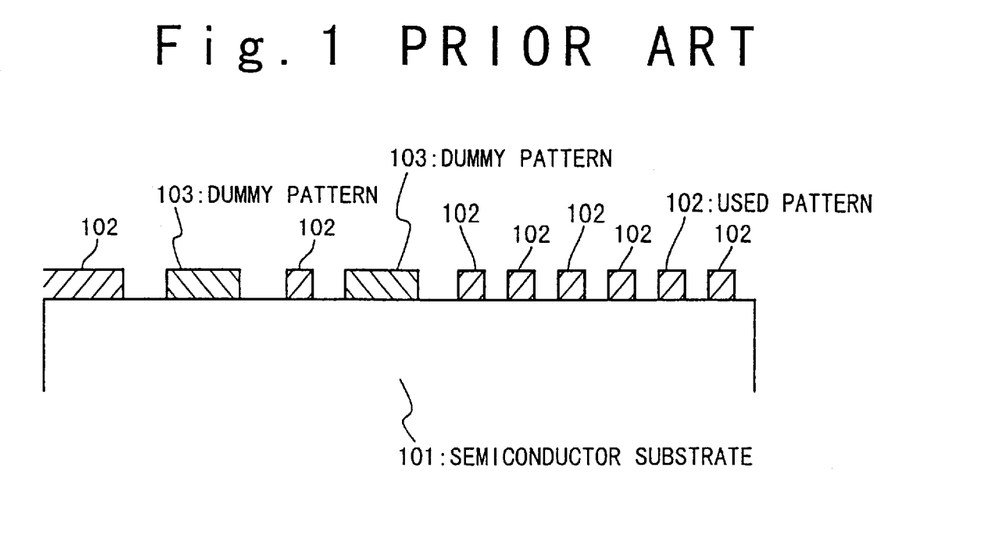
FIG. 1 is a cross sectional view showing a semiconductor memory device in a first conventional example.

Japanese Laid Open Patent Application (JP-A-Heisei 4-130709: a first conventional example) is known to prevent the occurrence of the deviation in the characteristics of the gate electrode and wiring line. In the first conventional example, a wiring pattern (a dummy pattern) is arranged in a free space in a semiconductor chip with no relation of circuit connection. FIG. 1 is a cross sectional view of a semiconductor memory device in the first conventional example. Referring to FIG. 1, there are a region where an actual pattern 102 is formed and a region where the actual pattern 102 is not formed on a semiconductor substrate 101. A dummy pattern 103 is formed in the region where the actual pattern 102 is not formed. Thus, the difference in pattern density on the semiconductor substrate 101 is made gentle. As a result, the deviation in the size of the wiring line formed on the semiconductor substrate 101 is prevented.

Otherwise, Japanese Laid Open Patent Application (JP-A-Heisei 9-311432: a second conventional example) is known to prevent the deviation in the characteristic of a gate electrode and a wiring line. In the second conventional example, a pattern is formed on the semiconductor chip using a photo-resist as a mask. In the method of forming a pattern, a dummy pattern is formed in a free space where an actual pattern is not formed, to have the same pattern width as the actual pattern. The pattern density of the free space where the dummy pattern is formed is approximately the same as that of a region where the actual pattern is formed.

Figure 2:
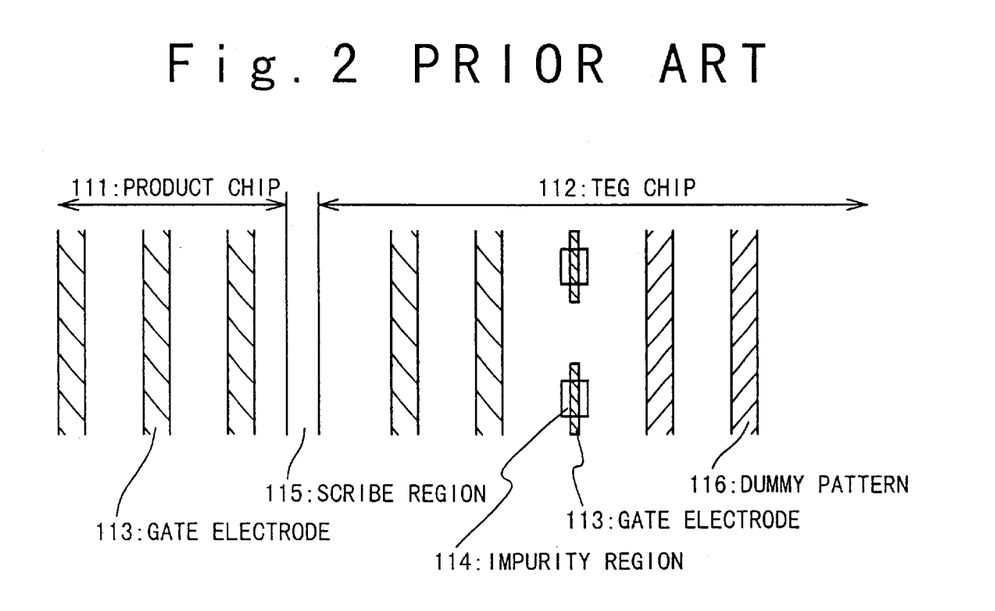
FIG. 2 is a plan view showing a pattern formed by a pattern forming method for a semiconductor device in a second conventional example.

FIG. 2 is a plan view showing the pattern which is formed by the pattern forming method for the semiconductor device in the second conventional example. Referring to FIG. 2, a product chip 111 and a TEG chip 112 are provided adjacently to each other. The product chip 111 contains a gate electrode 113. The TEG chip 112 contains a gate electrode 113, an impurity region 114 and a dummy pattern 116. The impurity region 114 is a part of the TEG. The product chip 111 and the TEG chip 112 are separated by a scribe region 115. The scribe region 115 is used when the chips are separated. The pattern width of the dummy pattern 116 is approximately equal to that of the gate electrode 113 formed in the product chip region. In this way, as shown in FIG. 2, in the second conventional example, the pattern density is made approximately uniform over the product chip 111 and the TEG chip 112. The second conventional example prevents the deviation in the size of the gate electrode and the size of the wiring line.

According to the second conventional example, the design of the dummy pattern is necessary in the TEG chip region in addition to the design of the TEG. Therefore, the design of the TEG chip region becomes complicated.

SUMMARY OF THE INVENTION

Therefore, an object of the present invention is to provide a semiconductor device manufacturing method and a semiconductor wafer in which a pattern density of a TEG region where TEG is formed is adjusted to that of a product chip region.

Another object of the present invention is to provide a semiconductor device manufacturing method and a semiconductor wafer in which a deviation in the size of a resist pattern can be prevented.

Still another object of the present invention is to provide a semiconductor device manufacturing method and a semiconductor wafer in which local deviation in pattern density in a TEG chip region can be prevented.

In an aspect of the present invention, a method of manufacturing a semiconductor device, is attained by (a) providing a first chip region and a second chip region on a silicon wafer, wherein a first resist pattern for the semiconductor device is to be formed in the first chip region, and the second chip region includes a plurality of characteristic evaluation regions for the semiconductor device, and a second resist pattern is to be formed in each of the plurality of characteristic evaluation regions for the semiconductor device; and by (b) determining a data rate of the second chip region based on a data rate of the first chip region.

The (b) determination may be attained by determining the data rate of the second chip region such that a ratio of the data rate of the first chip region to the data rate of the second chip region is in a range of ¼ to 4.

Also, each of the a plurality of characteristic evaluation regions may include a first region and a second region, and a size of the first region and a data rate of the first region are previously determined. In this case, the method may further include: (c) determining the number of the characteristic evaluation regions based on the size of the first region, the data rate of the first region, a data rate of the second region, and a size of the first chip region. In this case, the method may further include: (d) determining a size of the second region based on the number of the characteristic evaluation regions, the size of the first chip region, and the size of the first region.

Also, the data rate of the second region may be uniform over the second region, and the data rate of the second region may be locally high. Also, the first region and the second region may be provided adjacently, and the first region may be provided in the characteristic evaluation region at an optional position, and a region of the characteristic evaluation region other than the first region is the second region.

In another aspect of the present invention, a recording medium in which a program is stored for a method of manufacturing a semiconductor device. The method of manufacturing a semiconductor device, is attained by (a) providing a first chip region and a second chip region on a silicon wafer, wherein a first resist pattern for the semiconductor device is to be formed in the first chip region, and the second chip region includes a plurality of characteristic evaluation regions for the semiconductor device, and a second resist pattern is to be formed in each of the plurality of characteristic evaluation regions for the semiconductor device; and by (b) determining a data rate of the second chip region based on a data rate of the first chip region.

The (b) determination may be attained by determining the data rate of the second chip region such that a ratio of the data rate of the first chip region to the data rate of the second chip region is in a range of ¼ to 4.

Also, each of the a plurality of characteristic evaluation regions may include a first region and a second region, and a size of the first region and a data rate of the first region are previously determined. In this case, the method may further include: (c) determining the number of the characteristic evaluation regions based on the size of the first region, the data rate of the first region, a data rate of the second region, and a size of the first chip region. In this case, the method may further include: (d) determining a size of the second region based on the number of the characteristic evaluation regions, the size of the first chip region, and the size of the first region.

Also, the data rate of the second region may be uniform over the second region, and the data rate of the second region may be locally high. Also, the first region and the second region may be provided adjacently, and the first region may be provided in the characteristic evaluation region at an optional position, and a region of the characteristic evaluation region other than the first region is the second region.

In order to achieve still another aspect of the present invention, a semiconductor wafer includes a first chip region and a second chip region. A first resist pattern for a semiconductor device is to be formed in the first chip region. The second chip region includes a plurality of characteristic evaluation regions for the semiconductor device, and a second resist pattern is to be formed in each of the plurality of characteristic evaluation regions for the semiconductor device. Each of the a plurality of characteristic evaluation regions includes a first region and a second region, a test pattern for characteristic test of the semiconductor device is to be formed in the first region.

Also, it is desirable that a ratio of the data rate of the first chip region to the data rate of the second chip region is in a range of ¼ to 4. Also, the number of the characteristic evaluation regions may be determined based on the size of the first region, the data rate of the first region, a data rate of the second region, and a size of the first chip region. In addition, a size of the second region may be determined based on the number of the characteristic evaluation regions, the size of the first chip region, and the size of the first region.

DESCRIPTION OF THE PREFERRED EMBODIMENTS

Hereinafter, a semiconductor device manufacturing method of the present invention will be described below in detail with reference to the attached drawings.

Figure 3:
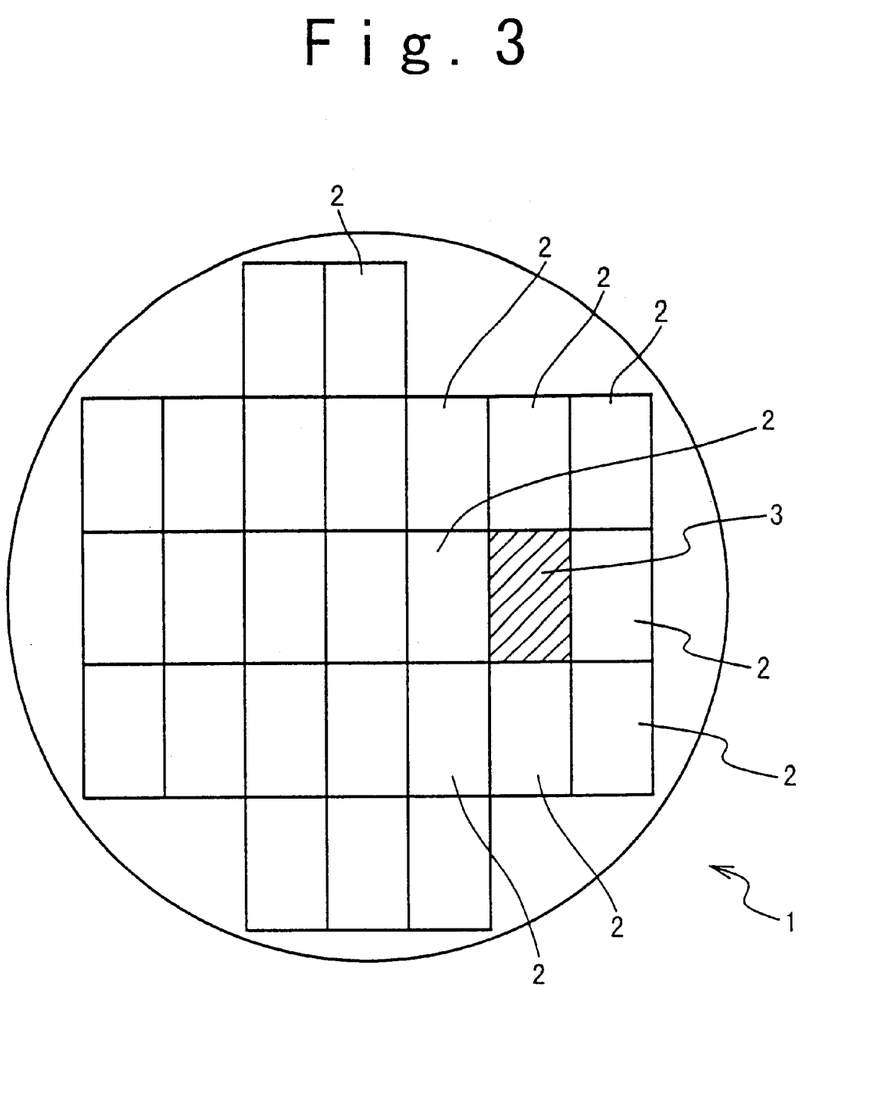
FIG. 3 is a diagram showing a chip arrangement of semiconductor devices on a silicon wafer of the present invention.

First, FIG. 3 shows a semiconductor wafer according to the first embodiment of the present invention. Referring to FIG. 3, a plurality of chip regions are provided on a silicon wafer 1 in the form of meshes. The plurality of chip regions composed of product chip regions 2 and TEG chip regions 3. In the product chip region 2, a desired semiconductor circuit is formed. In the TEG chip region 3, a device for characteristic evaluation is formed.

Figure 4:
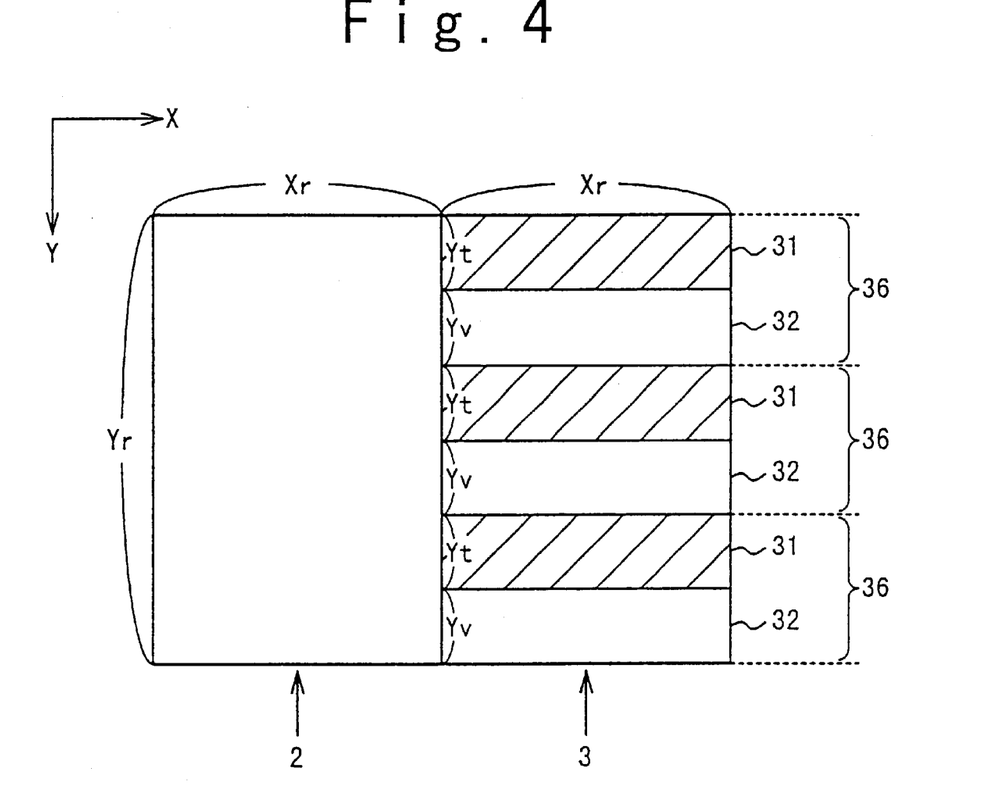
FIG. 4 is a diagram showing a product chip and a TEG chip which are formed on the silicon wafer according to a first embodiment of the present invention.

FIG. 4 shows an arrangement state in which the product chip region 2 and the TEG chip region 3 are adjacent to each other with respect to the Y direction. Referring to FIG. 4, the chip region has a rectangular shape with the length of Xr in an X direction and the length of Yr in a Y direction. The TEG chip region 3 is composed of a plurality of data rate adjusting regions 36 as characteristic evaluation regions. In the first embodiment, the data rate adjusting region 36 is composed of one set of a TEG region 31 and a free space 32. The above- mentioned device for characteristic evaluation is formed in the TEG region 31. In the first embodiment, any dummy pattern for adjusting a pattern density of the TEG region 31 to the product chip region 2 is not formed in the TEG region 31. The TEG region 31 has a rectangular shape with the length of Xr in the X direction and the length of Yt in the Y direction. The size of the TEG region 31 is predetermined to satisfy the following equation:

$$Yr = n \times Yt \text{ (n is a natural number)}$$

It is sufficient that the TEG regions 31 necessary to evaluate the characteristics are provided for the TEG chip region 3 at least. The TEG chip region 3 is not always necessary to be composed of only the TEG regions 31.

No pattern is formed in the free space 32. The free space 32 is rectangular to have the length of Xr in the X direction and the length of Yv in the Y direction. The size of the free space 32 is determined based on a data rate of the data rate adjusting region 36, as described later.

Through a plurality of processes carried out to the product chip region 2 and the TEG chip region 3, desired semiconductor devices are formed in the product chip region 2 and the TEG chip region 3. A process of forming a resist pattern on both of the chip regions is contained in the plurality of processes. The data rate or pattern density of the product chip region 2 and the data rate of TEG region 31 are previously determined with respect to the formed resist pattern. Also, the data rate of free space 32 is "0" or "1". Here, when a resist pattern is formed in a region, the data rate of the region is defined as a ratio of an area of a part of the region where the resist pattern remains, to an area of the whole region. The region is such as the product chip region 2, the TEG region 31, and the free space 32.

When a ratio of the data rate of the data rate adjusting region 36 to the data rate of the product chip region 2 falls within a predetermined range, the size deviation is not caused in the resist pattern formed in the product chip region 2 and the TEG chip region 3. It is desirable that the ratio of data rate in this case is in a range of ¼ to 4. It is more desirable that this ratio of the data rate is approximately "1". Therefore, the ratio of the data rate of the data rate adjusting region 36 to the data rate of the product chip region 2 is set to be in the range of ¼ to 4. At this time, the ratio of the data rate of the product chip region 2 and the data rate of the TEG chip region 3 falls within the range of ¼ to 4.

Next, a method of manufacturing a semiconductor device according to the first embodiment of the present invention will be described below. In the first embodiment, a positive type photo-resist is used for forming a resist pattern. It should be noted that the resist material to be used is not limited to the positive type photo-resist.

Figure 5:
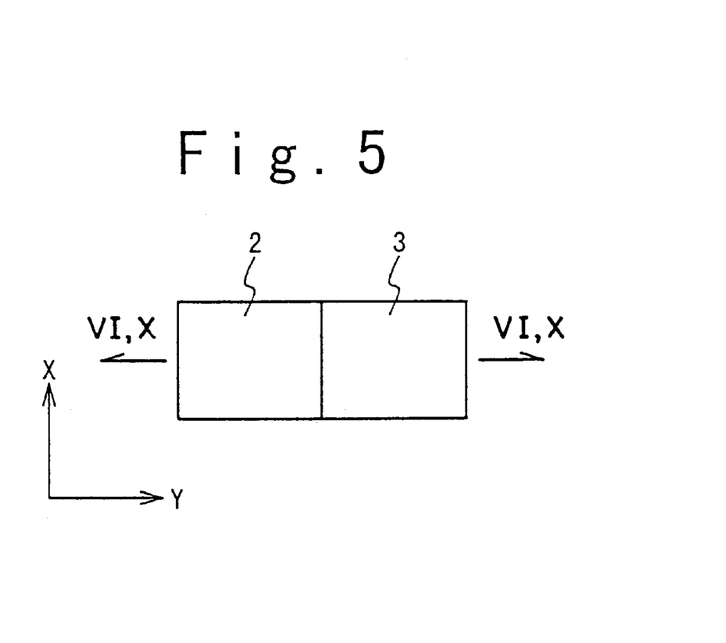
FIG. 5 is a diagram showing the product chip and the TEG chip adjacent to the product chip according to the first embodiment of the present invention.
Figure 6A:
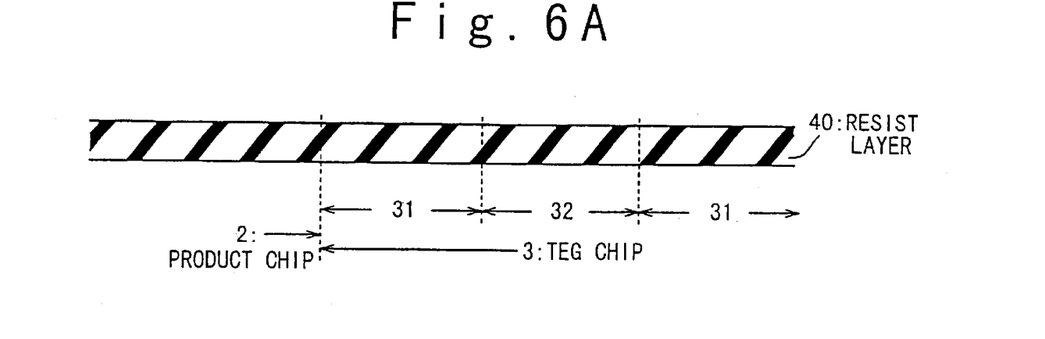
FIGS. 6A to 6C are cross sectional views showing a resist pattern forming method in the semiconductor device manufacturing method according to the first embodiment of the present invention.
Figure 6B:
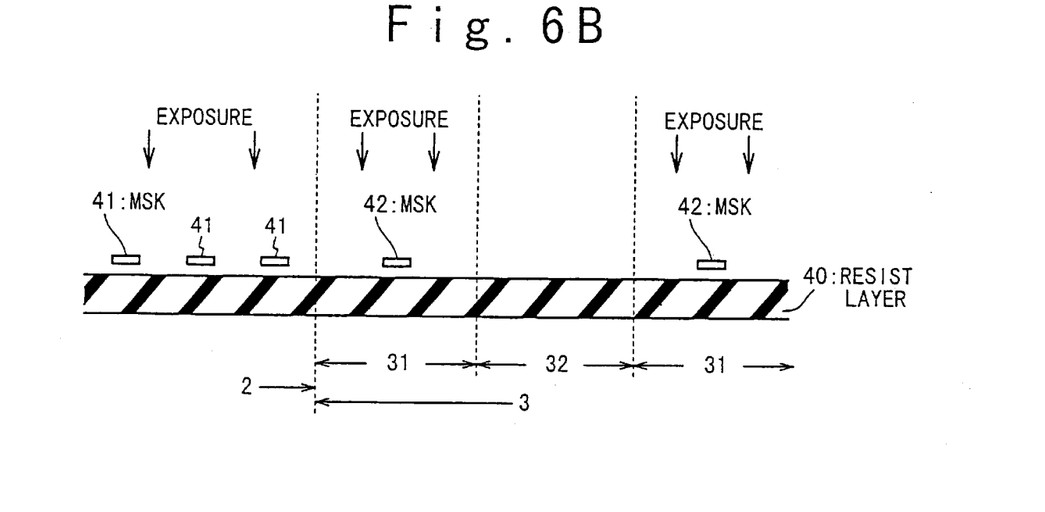
Figure 6C:
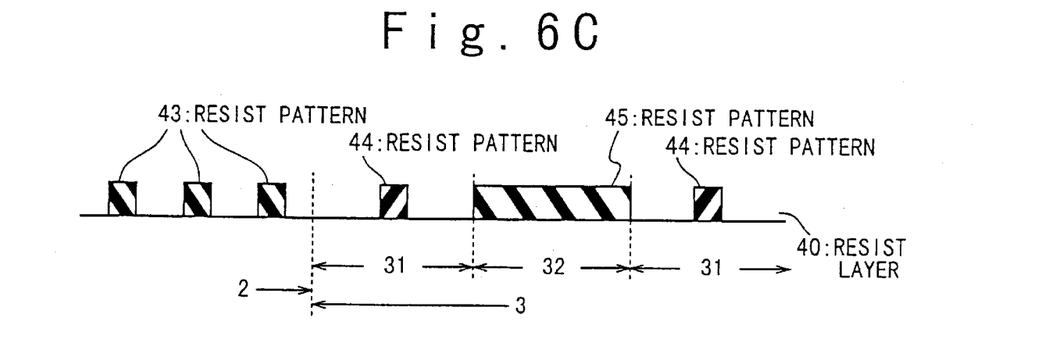

FIGS. 6A to 6C are cross sectional views showing the semiconductor device manufacturing method according to the first embodiment of the present invention. These sectional views are the cross sections of the product chip region 2 and the TEG chip region 3 shown with FIG. 5 along the line VI—VI. The arrangement of the TEG region 31 in the TEG chip region 3 is previously determined. A method of determining the arrangement of the TEG region 31 will be described later.

As shown in FIG. 6A, resist material is applied on the product chip region 2 and the TEG chip region 3 to form a resist layer 40. Subsequently, as shown in FIG. 6B, the resist layer 40 is exposed using a mask 41 for the product chip region 2. The resist layer 40 is exposed using a mask 42 for the TEG region 31. In this case, the free space 32 is not exposed. Lastly, as shown in FIG. 6C, the resist layer 40 is developed using developer. After the developing process, a resist pattern 43 and a resist pattern 44 are formed in the product chip region 2 and in the TEG chip region 3, respectively. The resist material is remained in the free space 32 to form a resist pattern 45.

Next, a method of determining the arrangement of the TEG region 31 will be described below. The number of TEG regions 31 necessary to test the characteristics of the semiconductor device is previously determined.

The mask 41 for the product chip region 2 and the mask 42 for the TEG region 31 are previously designed. The resist patterns are formed in the product chip region 2 and the TEG region 31 using these masks 41 and 42. Therefore, the data rate Dr ($0 \leq Dr \leq 1$) of the product chip region 2 and the data rate Dt ($0 \leq Dt \leq 1$) of the TEG region 31 are previously determined. In the first embodiment, because the resist pattern remains in the free space 32, the data rate of the free space 32 is "1". Also, when any resist pattern is not formed in the free space 32, the data rate of the free space 32 is "0".

It is supposed that the number of TEG regions 31 which should be provided for the TEG chip region 3 is St (St is a natural number). The number of TEG regions 31 St is equal to or more than the number of TEG regions necessary to test the characteristic of the semiconductor device. The number of TEG regions 31 St is determined based on the data rate of the product chip region 2 and the data rate of the TEG chip region 3.

The data rate Dtc of the TEG chip region 3 is expressed by the following equation.

Dtc=((area of TEG region)×(data rate of TEG region)+(area of free space)×(data rate of free space)÷(area of TEG chip region)

That is, $$Dtc = \frac{St \times Xt \times Yt \times Dt + (Xt \times Yr - St \times Xt \times Yt)}{Xt \times Yr} \quad (1)$$
$$= \frac{St \times Yt \times Dt + (Yr - St \times Yt)}{Yr}$$
$$= 1 - \frac{St \times Yt \times (1 - Dt)}{Yr}$$

In the present invention, the ratio of the data rate Dr of the product chip region 2 to the data rate Dtc of the TEG chip region 3 is in a range of ¼ to 4. The relation of the data rate Dr of the product chip region 2 and the data rate Dtc of the TEG chip region 3 satisfies the following equation (2).

$$\frac{1}{4}Dr \leq Dtc = 1 - \frac{St \times Yt \times (1 - Dt)}{Yr} \leq 4Dr \quad (2)$$

The equation (2) is transformed and the number of TEG regions 31 St which should be provided for the TEG chip region 3 is determined. The number of TEG regions 31 St is determined from the following equation (3).

$$\frac{Yt \times (1 - 4Dr)}{Yt \times (1 - Dt)} \leq St \leq \frac{Yr \times \left(1 - \frac{Dr}{4}\right)}{Yt \times (1 - Dt)} \quad (3)$$

Out of the values of St which satisfies the equation (3), the TEG regions 31 equal to or more than the number of TEG regions necessary to test the characteristics of the semiconductor device are provided for the TEG chip region 3. In this case, it is desirable that the data rate Dr of the product chip region 2 is approximately equal to the data rate Dtc of the TEG chip region 3, as shown by the following equation (4).

$$Dr \approx 1 - \frac{St \times Yt \times (1 - Dt)}{Yr} \quad (4)$$

The equation (4) is transformed and the number of TEG regions 31 St to be provided for the TEG chip region 3 is determined. The number of TEG regions 31 St is determined from the following equation (5).

$$St \approx \frac{Yr \times (1 - Dr)}{Yt \times (1 - Dt)} \quad (5)$$

Next, the arrangement of the TEG region 31 in the TEG chip region 3 is determined. The TEG regions 31 St of the number determined above are arranged in the TEG chip region 3. As shown in FIG. 4, in the first embodiment, the TEG chip region 3 is composed of the St data rate adjusting regions 36. The data rate adjusting region 36 is composed of a set of the TEG regions 31 and the free space 32. The TEG regions 31 are arranged to have the length of the free space 32 in the Y direction as an interval. The length of the free space 32 in the Y direction is determined based on the following equation (6).

Yr=St×(Yt+Yv)

$$Y = \frac{Yr}{St} - Yt \quad (6)$$

A case where the interval between the TEG regions 31 is constant will be described below as a first example of a modification of the first embodiment. In the first modification, the free spaces 32 are arranged in the both ends of the TEG chip region 3 in the Y direction. In this case, the interval between the TEG regions 31 is the length Yv of the free space 32 in the Y direction. The length Yv is determined based on the following equation (7).

Yr=St×Yt+(St+1)×Yv $$Yv = \frac{Yr - St \times Yt}{(St + 1)} \quad (7)$$

A second example of the modification in which the TEG regions 31 are arranged in the both ends of the TEG chip region 3 in the Y direction will be described. In this case, the interval between the TEG regions 31 is the length Yv of the free space 32 in the Y direction. The length Yv is determined based n the following equation (8).

Yr=St×Yt+(St-1)×Yv $$Yv = \frac{Yr - St \times Yt}{(St - 1)} \quad (8)$$

Moreover, a third example of the modification in which the TEG region 31 is arranged in at least an end in the Y direction of the TEG chip region 3 will be described. The length of the free space 32 in the Y direction is shorter than the interval between the TEG regions 31. In this case, the interval between the TEG regions 31 is equal to or larger than the length Yv determined from the equation (7) and equal to or smaller than Yv determined from the equation (8).

Next, a case where the TEG region 31 is arranged in an optional position in the data rate adjusting region 36 will be described as a second modification in the first embodiment. For example, one TEG region 31 is arranged only in either of the top portion, center portion and a bottom portion of the data rate adjusting region 36. In this case, the St data rate adjusting region 36 are arranged in the TEG chip region 3.

The TEG regions 31 are fixed through all the manufacturing processes when the arrangement of the TEG regions is determined once. Therefore, the arrangement of the TEG region 31 is determined based on which of the resist patterns should be most prevented from development deviation. Also, the arrangement of the TEG region 31 can be determined even if there are a plurality of concerned resist patterns.

In the manufacturing method of the semiconductor device according to the first embodiment of the present invention, the ratio of the data rate of the product chip region 2 to the data rate of the TEG chip region 3 falls within a predetermined range of ¼ to 4. Also, the ratio of the data rate of the product chip region 2 to the data rate of data rate adjusting region 36 falls within the predetermined range of ¼ to 4. Therefore, there is no local deviation in the data rate of the TEG chip region 3. In this way, the resist patterns can be formed in the product chip region 2 and the TEG chip region 3 without the deviation.

Next, the method of manufacturing the semiconductor device according to the second embodiment of the present invention will be described below.

Figure 7:
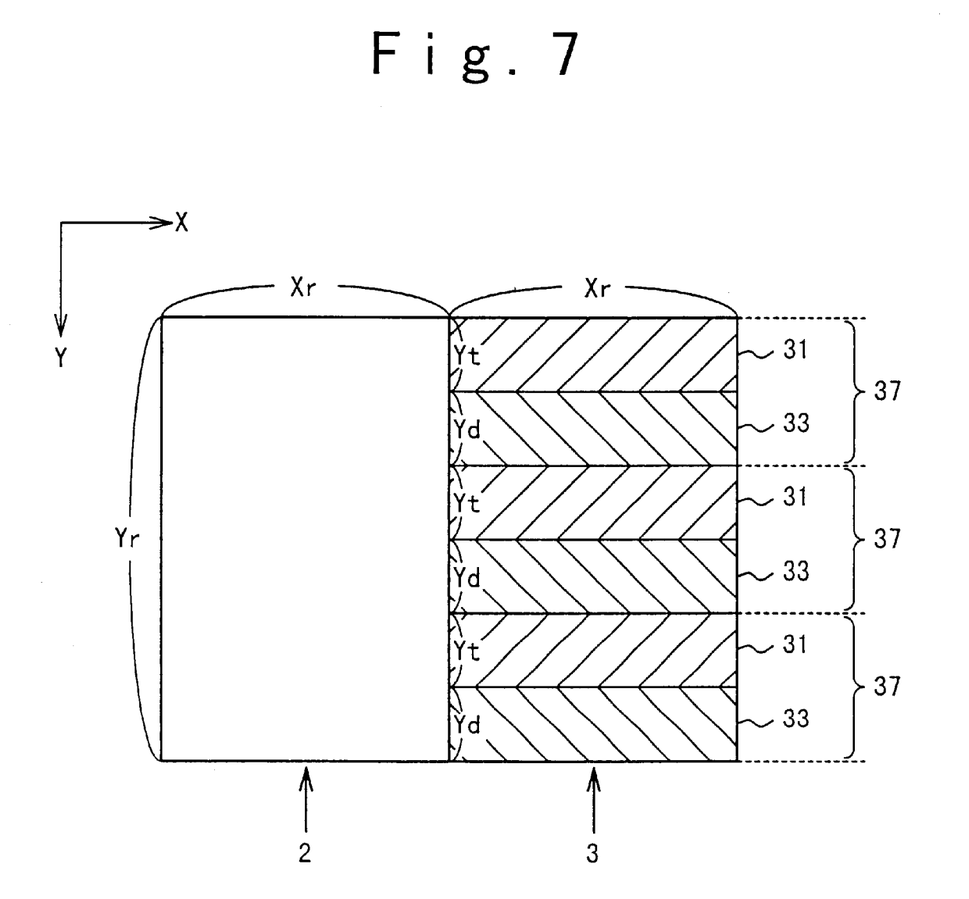
FIG. 7 is a diagram showing the product chip and the TEG chip provided on a silicon wafer according to a second embodiment of the present invention.

Referring to FIG. 7, the product chip region 2 and the TEG chip region 3 are arranged adjacently with respect to the Y axial. The product chip region 2 is the same as the semiconductor device according to the first embodiment of the present invention.

The TEG chip region 3 is composed of a plurality of data rate adjusting regions 37. The data rate adjusting region 37 is composed of a set of the TEG regions 31 and a dummy region 33. The TEG region 31 is the same as the semiconductor device according to the first embodiment of the present invention. The dummy region 33 is provided adjacent to the TEG region 31. The dummy region 33 has a rectangular shape with the length of Yd (Yd<Yr) in the Y direction and the length Xt in the X direction. A dummy pattern is formed in the dummy region 33. The data rate Dd of the dummy region 33 is 0≦Dd≦1. The size and data rate of the dummy region 33 are determined based on the data rate of data rate adjusting region 37, as described later.

Figure 8:
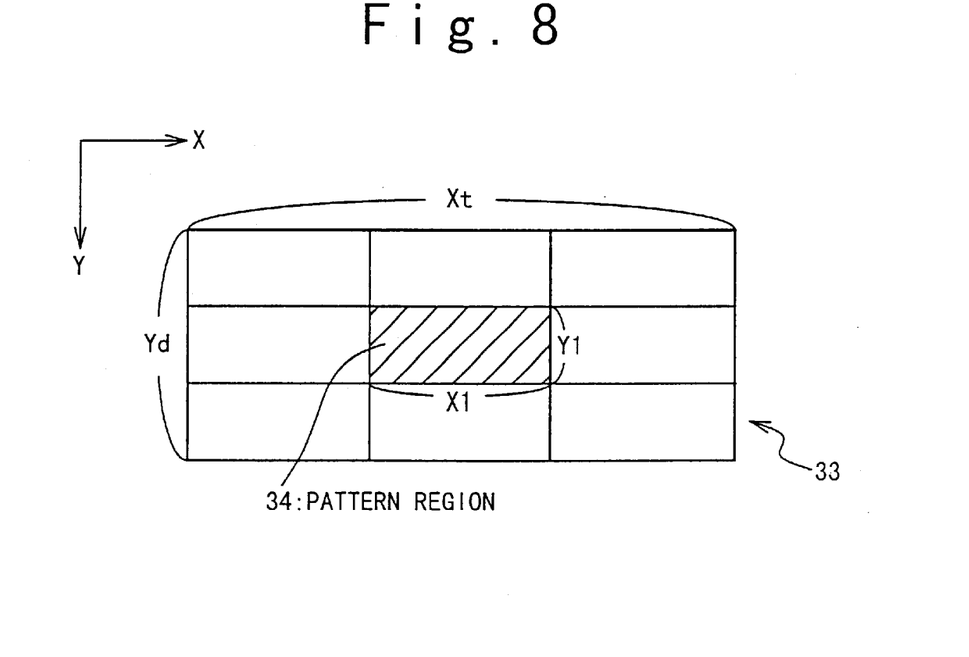
FIG. 8 is a plan view showing a specific example of a resist pattern of a dummy region in the second embodiment.
Figure 9:
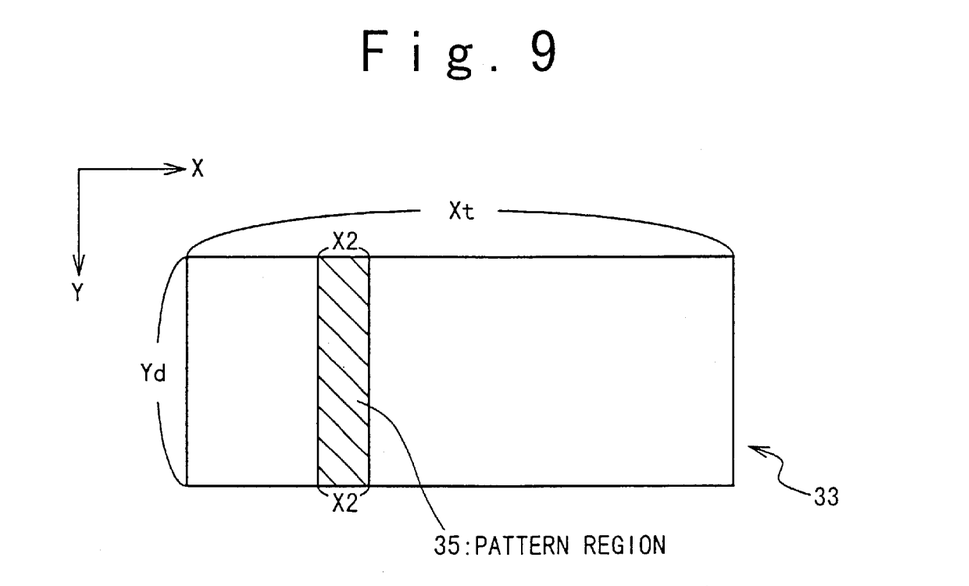
FIG. 9 is a plan view showing another specific example of a resist pattern of a dummy region in the second embodiment.

FIGS. 8 and 9 are specific examples of the resist patterns of the dummy region 33.

As shown in FIG. 8, the pattern regions are arranged in the dummy region 33 to have a lattice structure. Resist material remains in a pattern region 34 when the resist pattern is formed. The pattern region 34 has a rectangular shape with the length of X1 in the x direction and the length of Y1 in the Y direction. The lengths of X1 and Y1 satisfy the following equation (9).

$$Xt \times Yd \times Dd = X1 \times Y1 \quad (9)$$

The left side of the equation (9) shows the region of the resist material which remains in the dummy region 33 in case of forming the resist pattern.

Also, two or more pattern regions 34 may be arranged in one dummy region 33. In this case, the size of each of the pattern regions 34 is determined such that the total area of the plurality of pattern regions 34 is equal to the left side of the equation (9).

Besides, a pattern region 35 having a line pattern may be arranged in the dummy region 33, as shown in FIG. 9. This pattern region 35 having the line pattern is a rectangular region with the length of X2 in the X direction and the length of Yd in the Y direction. The length X2 satisfies the following equation (10).

$$Xt \times Yd \times Dd = X2 \times Yd \quad (10)$$

The left side of the equation (10) shows an area of the resist material which remains in the dummy region 33 in case of forming the resist pattern.

Also, two or more pattern regions 35 may exist in one dummy region 33. In this case, the size of each of the pattern regions 35 is determined such that the total area of the plurality of pattern regions 35 is equal to the left side of the equation (10).

Next, the manufacturing method of the semiconductor device according to the second embodiment of the present invention will be described below. In the second embodiment, a positive type photo-resist is used to form a resist pattern. It should be noted that the photo-resist to be used is not limited to the positive type.

Figure 10A:
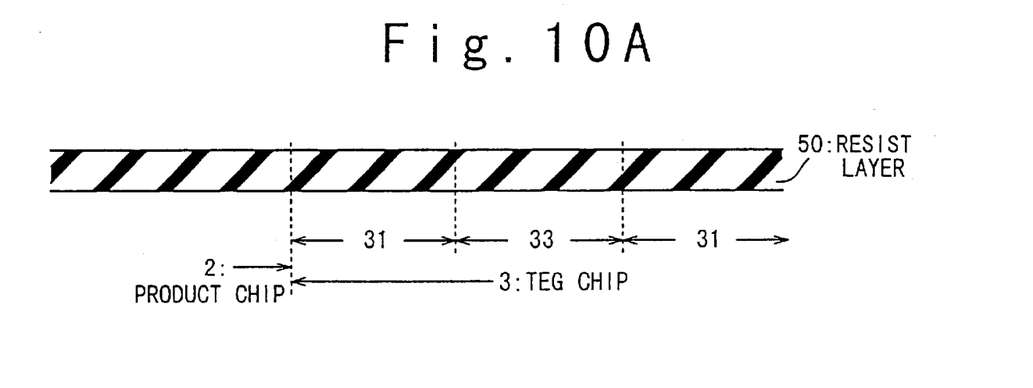
FIGS. 10A to 10C are cross sectional views showing a resist pattern forming method in the semiconductor device manufacturing method according to the second embodiment of the present invention.
Figure 10B:
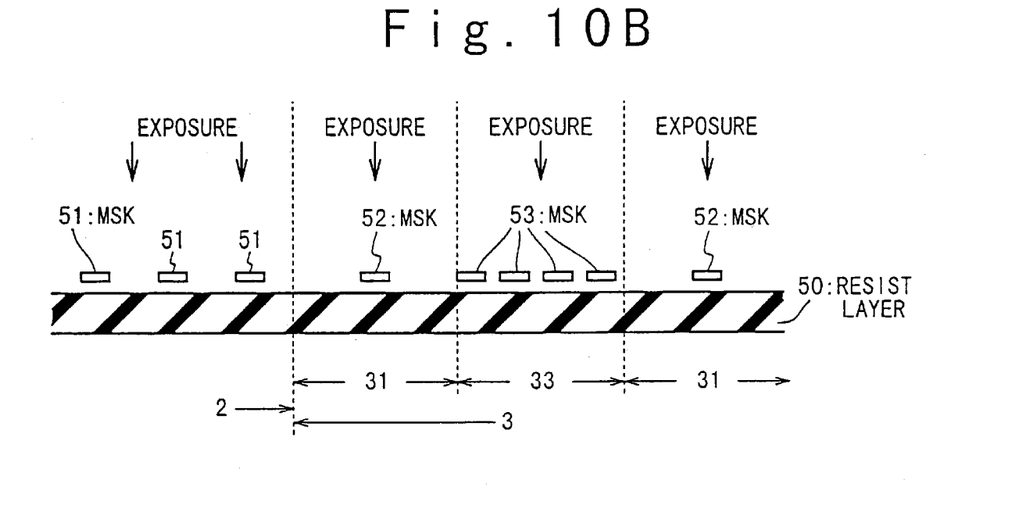
Figure 10C:
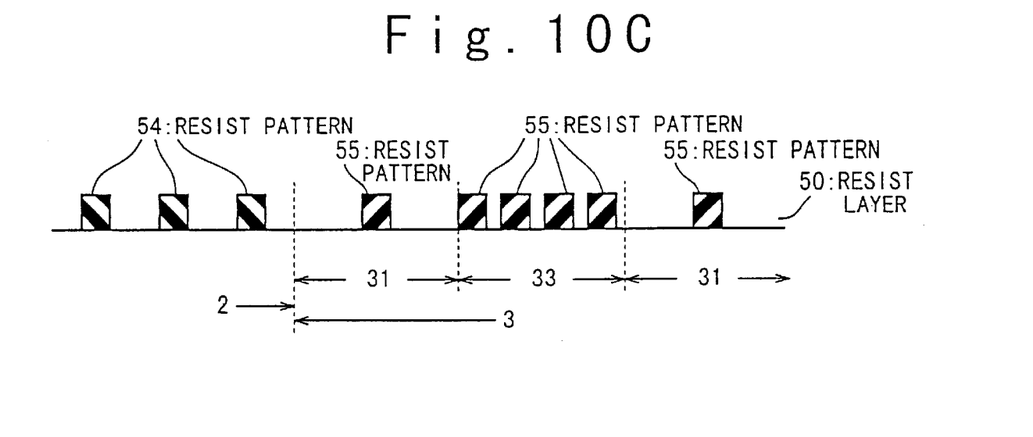

FIGS. 10A to 10C are cross sectional views showing the manufacturing method of the semiconductor device according to the second embodiment of the present invention. FIGS. 10A to 10C show the cross sectional views along the line X—X of the product chip region 2 and the TEG chip region 3 shown in FIG. 5.

The arrangement of the TEG regions 31 in the TEG chip region 3 and the data rate of the dummy region 33 are previously determined. A method of determining the arrangement of the TEG region 31 and the data rate of the dummy region 33 will be described later.

Next, a mask 53 for the dummy region 33 shown in FIG. 8 or FIG. 9 is formed based on the data rate of the dummy region 33. Also, the mask 53 for the dummy region 33 may be determined as described below. That is, a plurality of masks are previously prepared for different data rates. When the data rate of the dummy region 33 is determined, one of the plurality of masks is selected based on the determined data rate of the dummy region 33.

Next, a resist layer 50 is formed on the product chip region 2 and the TEG chip region 3, as shown in FIG. 10A. Subsequently, the resist layer 50 is exposed using the mask 51 for the product chip region 2, as shown in FIG. 10B. Also, the resist layer 50 is exposed using the mask 52 for the TEG region 31. Further, the resist layer 50 is exposed using the mask 53 for the dummy region 33. Last, the exposed resist layer 50 is developed, as shown in FIG. 10C. As a result, a resist pattern 54 and a resist pattern 55 are formed in the product chip region 2 and in the TEG chip region 3.

Next, a method of determining the arrangement of the TEG region 31 and the data rate of the dummy region 33 will be described below. The number of TEG regions 31 necessary to test the characteristics of the semiconductor device is previously determined.

The masks 51 and 52 are previously designed for the product chip region 2 and the TEG region 31. The resist patterns are formed using these masks 51 and 52 in the product chip region 2 and the TEG region 31. The data rate Dr (0≦Dr≦1) of the product chip region 2 and the data rate Dt (0≦Dt≦1) of the TEG region 31 are previously determined. The data rate of the dummy region 33 is temporarily determined as Dd (0≦Dd≦1).

The number of TEG regions 31 which should be provided for the TEG chip region 3 is St (St: a natural number) in this embodiment. The number of TEG regions 31 St is equal to or more than the number of TEG regions necessary to test the characteristics. The number of TEG regions St is determined based on the data rate of the product chip region 2 and the data rate of the TEG chip region 3. The data rate Dtc of the TEG chip region 3 is determined using the following equation (11).

$$Dtc = \frac{St \times Xt \times Yt \times Dt + (Xt \times Yr - St \times Xt \times Yt) \times Dd}{Xt \times Yr}$$

$$= \frac{St \times Yt \times Dt + (Yr - St \times Yt) \times Dd}{Yr}$$

$$= Dd - \frac{St \times Yt \times (Dd - Dt)}{Yr} \quad (11)$$

In the present invention, the ratio of the data rate Dr of the product chip region 2 to the data rate Dtc of the TEG chip region 3 is in a range of ¼ to 4. As the following equation (12), the relation of the data rate of the product chip region 2 and the data rate of the TEG chip region 3 is as follows.

$$\frac{1}{4}Dr \le Dtc = Dd - \frac{St \times Yt \times (Dd - Dt)}{Yr} \le 4Dr \quad (12)$$

The equation (12) is transformed and the number of TEG regions St which should be provided for the TEG chip region 3 is determined, based on the following equation (13).

$$\frac{Yt \times (Dd - 4Dr)}{Yt \times (Dd - Dt)} \le St \le \frac{Yr \times \left(Dd - \frac{Dr}{4}\right)}{Yt \times (Dd - Dt)} \quad (13)$$

Out of the values of St which satisfies the equation (13), the TEG regions 31 equal to or more than the number of the TEG regions necessary to test the characteristics are provided for the TEG chip region 3. In this case, it is desirable that the data rate Dr of the product chip region 2 is approximately equal to the TEG chip region 3. The equation in this case is shown by the following equation (14).

$$Dr \approx Dd - \frac{St \times Yt \times (Dd - Dt)}{Yr} \quad (14)$$

The equation (14) is transformed and the number of TEG regions St which should be provided for the TEG chip region 3 is determined, based on the equation (15).

$$St \approx \frac{Yr \times (Dd - Dr)}{Yt \times (Dd1 - Dt)} \quad (15)$$

When the number of TEG regions St which satisfies the equation (15) is equal to or more than the number of TEG regions necessary to test the characteristics, the number of TEG regions 31 which are provided for the TEG chip region 3 satisfy the equation (15).

Next, the equation (12) is transformed and the data rate Dd of the dummy region 33 is determined based on the following equation (16).

$$\frac{(1/4)Yr \times Dr - St \times Yt \times Dt}{Yt - St \times Yt} \le Dd \le \frac{4Yr \times Dr - St \times Yt \times Dt}{Yr - St \times Yt} \quad (16)$$

It is desirable that the data rate Dr of the product chip 2 is approximately equal to the data rate Dt of the TEG chip 3. In this case, the data rate Dd of the dummy region 33 is determined by transforming the equation (15), as shown in the following equation (17).

$$Dd = \frac{Yr \times Dr - St \times Yt \times Dt}{Yr - St \times Yt} \quad (17)$$

Next, the arrangement of the TEG region 31 in the TEG chip region 3 is previously determined. The St TEG regions 31 are arranged in the TEG chip region 3. In the second embodiment, as shown in FIG. 7, the TEG chip region 3 is composed of the St data rate adjusting regions 37. The data rate adjusting region 37 is composed of a set of the TEG regions 31 and the dummy region 33. The TEG region 31 is arranged to have the length of the dummy region 33 in the Y direction as an interval between the TEG regions 31. The length of the dummy region 33 in the Y direction is determined from the following equation (18).

$$Yr = St \times (Yt + Yd)$$

$$Yd = \frac{Yr}{St} - Yt \quad (18)$$

A first example of a modification of the first embodiment in which the interval between the TEG regions 31 is constant will be described below. First, the dummy region 33 is arranged in the both ends of the TEG chip region 3 in the Y direction. In this case, the interval between the TEG regions 31 is equal to the length Yd of the dummy region 33 in the Y direction, as determined based on the following equation (19).

$$Yr = St \times Yt + (St+1) \times Yd$$

$$Yd = \frac{Yr - St \times Yt}{(St+1)} \quad (19)$$

In a second example of the modification, the TEG regions 31 are arranged in the both ends of the TEG chip region 3 in the Y direction. In this case, the interval between the TEG region 31 is equal to the length Yd of the dummy region 33 in the Y direction, as determined from the following equation (20).

$$Yr = St \times Yt + (St+1) \times Yd$$

$$Yd = \frac{Yr - St \times Yt}{(St-1)} \quad (20)$$

Moreover, in a third example of the modification, the dummy region 33 is arranged at least an end of the TEG chip region 3 in the Y direction. In this case, the length of the arranged dummy region 33 in the Y direction is shorter than the interval between the TEG regions 31. The interval between the TEG regions 31 is equal to or longer than the length Yd determined from the equation (19) and is equal to or shorter than the length Yd determined from the equation (20).

As the second modification of the second embodiment, a case where the TEG region 31 is arranged in an optional position in the data rate adjusting region 37. For example, it is supposed that one TEG region 31 is arranged only in the top portion, the center portion or the bottom portion of the data rate adjusting region 37. That is, the St data rate adjusting regions 37 are arranged in the TEG chip region 3. The TEG region 31 is arranged in the optional position in the data rate adjusting region 37.

The TEG region 31 is fixed through all the manufacturing processes when the arrangement of the TEG region 31 is determined once. Therefore, the arrangement of the TEG region 31 is determined based on which of the resist patterns should be most prevented from development deviation. Also, the arrangement of the TEG region 31 can be determined even if there are a plurality of concerned resist patterns.

In the manufacturing method of the semiconductor device according to the second embodiment of the present invention, the ratio of the data rate of the product chip region 2 to the data rate of the TEG chip region 3 falls within a predetermined range of ¼ to 4. Also, the interval between the TEG regions 31 is constant. Therefore, there is no local deviation in the data rate of the TEG chip region 3. In this way, the resist patterns can be formed in the product chip region 2 and the TEG chip region 3 without the deviation.

A program for the above method of manufacturing the semiconductor device may be stored in a recording medium, and a processor may executes the program. In this case, the number and size of data rate adjusting regions can be automatically determined and the data rate adjusting regions can be automatically arranged in the TEG chip region.

As described above, according to the semiconductor device manufacturing method and the semiconductor wafer of the present invention, the density of the TEG regions can be adjusted to the pattern density of the product chip region.

Also, according to the semiconductor device manufacturing method and the semiconductor wafer of the present invention, deviation in the size of the resist pattern used in the semiconductor device manufacturing process can be prevented.

Moreover, according to the semiconductor device manufacturing method and the semiconductor wafer of the present invention, local deviation in the pattern density of the TEG chip region can be prevented.

What is claimed is:

1. A method of manufacturing a semiconductor device, comprising the steps of:
    providing a product chip region and a TEG chip region on a silicon wafer, wherein said TEG chip region includes a plurality of characteristic evaluation regions for said semiconductor device;
    forming a first resist pattern for said semiconductor device to be formed in said product chip region;
    forming a second resist pattern in said TEG chip region, in each of said plurality of characteristic evaluation regions for said semiconductor device; and
    determining a data rate of said TEG chip region based on a data rate of said product chip region.

2. The method according to claim 1, wherein the data rate determining step determines said data rate of said product chip region such that a ratio of said data rate of said product chip region to said data rate of said TEG chip region is in a range of ¼ to 4.

3. The method according to claim 1, wherein each of said plurality of characteristic evaluation regions includes a first region and a second region, and a size of said first region and a data rate of said first region being predetermined, the method further comprising the step of determining the number of said characteristic evaluation regions based on said size of said first region, said data rate of said first region, a data rate of said second region, and a size of said product chip region.

4. The method according to claim 3, further comprising the step of determining a size of said second region based on the number of said characteristic evaluation regions, said size of said product chip region, and said size of said first region.

5. The method according to claim 3, wherein said data rate of said second region is uniform over said second region.

6. The method according to claim 3, wherein said data rate of said second region is locally high.

7. The method according to claim 3, wherein said first region and said second region are provided adjacently.

8. The method according to claim 3, wherein said first region is provided in said characteristic evaluation region at an optional position, and a region of said characteristic evaluation region other than said first region is said second region.

9. A method of manufacturing a semiconductor device for storing a program in a recording medium, comprising the steps of:
    providing a product chip region and a TEG chip region on a silicon wafer, wherein said TEG chip region includes a plurality of characteristic evaluation regions for said semiconductor device;
    forming a first resist pattern for said semiconductor device to be formed in said product chip region;
    forming a second resist pattern in said TEG chip region, in each of said plurality of characteristic evaluation regions for said semiconductor device; and
    determining a data rate of said TEG chip region based on a data rate of said product chip region.

10. The method according to claim 9, wherein the data rate determining step determines said data rate of said product chip region such that a ratio of said data rate of said product chip region to said data rate of said TEG chip region is in a range of ¼ to 4.

11. The method according to claim 9, wherein each of said plurality of characteristic evaluation regions includes a first region and a second region, and a size of said first region and a data rate of said first region being predetermined, the method further comprising the step of determining the number of said characteristic evaluation regions based on said size of said first region, said data rate of said first region, a data rate of said second region, and a size of said product chip region.

12. The method according to claim 11, further comprising the step of determining a size of said second region based on the number of said characteristic evaluation regions, said size of said first chip region, and said size of said first region.

13. The method according to claim 11, wherein said data rate of said second region is uniform over said second region.

14. The method according to claim 11, wherein said data rate of said second region is locally high.

15. The method according to claim 11, wherein said first region and said second region are provided adjacently.

16. The method according to claim 11, wherein said first region is provided in said characteristic evaluation region at an optional position, and a region of said characteristic evaluation region other than said first region is said second region.

17. A semiconductor wafer comprising:
    a product chip region;
    a TEG chip region;
    a first resist pattern for a semiconductor device formed in said product chip region;
    a plurality of characteristic evaluation regions for said semiconductor device in said TEG chip region; and
    a second resist pattern formed in said TEG chip region, in each of said plurality of characteristic evaluation regions for said semiconductor device,
    wherein each of said plurality of characteristic evaluation regions includes a first region and a second region, and a test pattern for characteristic test of said semiconductor device formed in said product chip region.

18. The semiconductor wafer according to claim 17, wherein a ratio of said data rate of said product chip region to said data rate of said TEG chip region is in a range of ¼ to 4.

19. The semiconductor wafer according to claim 17, wherein the number of said characteristic evaluation regions is determined based on said size of said first region, said data rate of said first region, a data rate of said second region, and a size of said product chip region.

20. The semiconductor wafer according to claim 17, wherein a size of said second region is determined based on the number of said characteristic evaluation regions, said size of said product chip region, and said size of said first region.

* * * * *